United States Patent [19]

Banks et al.

[11] 4,361,643

[45] Nov. 30, 1982

[54] PHOTOMASK AND METHOD OF USING SAME

[75] Inventors: Edward L. Banks, Willingboro Township, Burlington County, N.J.; Bruce E. Truax, Durham Township, Middlesex County, Conn.; Laurence S. Watkins, Hopewell Township, Mercer County, N.J.

[73] Assignee: Western Electric Co., Inc., New York, N.Y.

[21] Appl. No.: 287,970

[22] Filed: Jul. 29, 1981

Related U.S. Application Data

[63] Continuation-in-part of Ser. No. 222,451, Jan. 5, 1981, abandoned.

[51] Int. Cl.³ ............................ G03C 5/06; G03F 9/00
[52] U.S. Cl. ..................................... 430/396; 118/504;
118/505; 156/145; 427/164; 427/287; 428/38;
428/203; 428/209; 428/210; 428/409; 428/432;
430/5

[58] Field of Search .................. 156/145, 99, 107;
428/13, 14, 34, 38, 209, 210, 409, 913, 68, 156,
173, 195, 203, 332, 336, 337, 410, 426, 432, 433;
430/4, 5, 396; 118/504, 505; 427/162–166, 287

[56] References Cited

U.S. PATENT DOCUMENTS

| 1,985,074 | 12/1934 | Bauersfeld | 88/24 |
| 2,175,343 | 10/1939 | Cunningham et al. | 88/26 |
| 2,317,550 | 4/1943 | Ormond | 88/24 |
| 3,193,840 | 7/1965 | Mercer | 352/130 |
| 3,400,995 | 9/1968 | Borberg et al. | 352/222 |
| 3,906,133 | 9/1975 | Flutie | 428/172 |
| 4,201,581 | 5/1980 | Thomas et al. | 430/396 |
| 4,256,787 | 3/1981 | Shaver et al. | 428/209 |

Primary Examiner—Bruce H. Hess
Attorney, Agent, or Firm—D. J. Kirk

[57] ABSTRACT

A photomask (30) used to form patterns on a resist coated semiconductor wafer is comprised of a transparent baseplate (31) having a thin metallic pattern (32) thereon; a transparent, planar coverplate (33) in intimate contact with the patterned baseplate (31) and an index matching fluid (34) interposed therebetween.

4 Claims, 5 Drawing Figures

FIG.-3
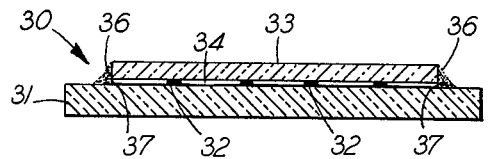
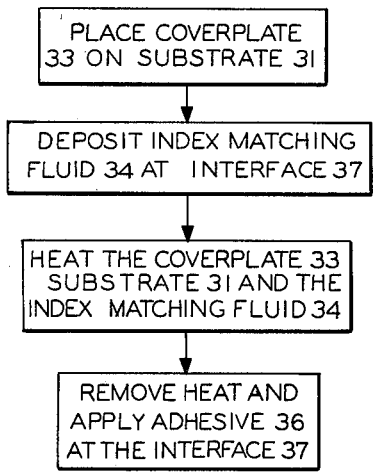
FIG.-4

PHOTOMASK AND METHOD OF USING SAME

This application is a continuation-in-part of our copending United States patent application Ser. No. 222,451, filed Jan. 5, 1981, entitled "A Photomask and Method For Fabricating Same" which is assigned to the instant assignee.

TECHNICAL FIELD

The instant invention relates to integrated circuit photomasks. In particular, the invention is directed to photomasks, techniques for manufacturing same, and for methods of using such masks in projection printing.

BACKGROUND OF THE INVENTION

Photomasks used for projection printing, wherein the photomask is spaced from a resist coated semiconductor wafer or the like, have high resolution metallic patterns on glass substrates, with feature sizes rapidly approaching the 1 82 m-2 µm range. The quality of the pattern is very critical to the semiconductor manufacturing process, thus, care is taken to fabricate such photomasks substantially free of any defects.

Maintaining the photomasks in this defect free state is essential if acceptable device yields are to be obtained. In addition to particulate contamination, the various cleaning and handling operations that the photomask is subjected to can cause a slow deterioration of the pattern. Furthermore, it has been found that electrostatic charges build up on the face of the mask resulting in arcing between portions of the metallic patterns causing deterioration thereof. When these effects are multiplied by the six or more photomasks that are required to fabricate a semiconductor device, the yield loss can become significant. For these reasons it is economically desirable to find a method whereby the mask surface can be protected from both contamination and deterioration while maintaining acceptable resolution.

One approach to protecting the photomask pattern would be to deposit a simple protective coating thereon as described in U.S. Pat. No. 3,906,133 to Flutie. That patent describes an iron oxide masking layer on a transparent substrate which has a protective nitrocellulose coating thereon of a thickness greater than the height of protrusions on the surface of a resist coated wafer to be processed. However, the Flutie patent is directed to contact printing wherein the photomask is placed in intimate contact with the photoresist coated wafer. In projection printing the photomask is spaced from the resist coated wafer and the light passing through the photomask must be focused onto the resist coating by an optical system. It has been found that such protective coatings do not have uniform thickness and cause diffraction and aberrations in the focused projection printed pattern, resulting in unacceptable product.

SUMMARY OF THE INVENTION

The instant invention overcomes the foregoing problems with a photomask comprised of a transparent baseplate having a thin metallic pattern thereon, a planar transparent coverplate in initmate contact with the patterned surface of the baseplate with an index matching material interposed between the baseplate and coverplate.

In a further embodiment, the photomask is comprised of a light transmissive baseplate having metallized and unmetallized portions on a major surface thereon; and a coating material on at least the unmetallized portions of said surface, said material having substantially the same refractive index as said baseplate.

Additionally, the mask may be fabricated by placing the substantially flat coverplate in intimate contact with the baseplate having the metallic pattern thereon. One or more drops of refractive index matching fluid are deposited at the edge of the interface of the coverplate and baseplate and the combination is heated to draw the fluid between the coverplate and patterned baseplate. The interface is then sealed to maintain the fluid between the plates.

Furthermore, a substrate having a coating of photoresist thereon may be selectively exposed to light radiation by a method of positioning a photomask between a light source and the photoresist coated substrate. The photomask being comprised of: (a) a light transmissive baseplate having a thin metallic pattern thereon; (b) a light transmissive coverplate in intimate contact with the patterned baseplate; and (c) an index matching fluid interposed between the patterned baseplate and the coverplate. The light sorce is then activated to direct light radiation through the patterned photomask to selectively expose the photoresist coated substrate thereto.

Advantageously, the instant mask has a longer life than prior art masks and only minor cleaning is required.

Furthermore, the need for reinspection of the mask surface is substantially reduced.

Additionally, electrostatic arcing between metallic portions of the mask has been substantially eliminated.

Most importantly, the instant method of selectively exposing photoresist coated substrates has unexpectedly resulted in enhanced edge definition and virtually defect-free patterns in the photoresist.

BRIEF DESCRIPTION OF THE DRAWINGS

FIG. 3 is a cross-sectional view of the instant photomask;

FIG. 4 is a block diagram depicting the steps used to fabricate the instant mask.

DETAILED DESCRIPTION

Figure 1:
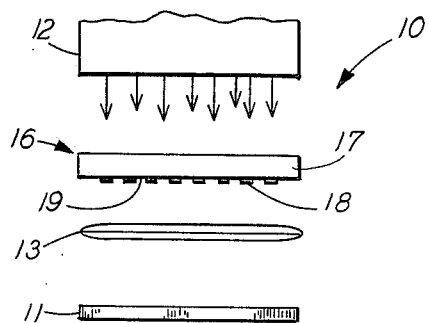
FIG. 1 is a schematic view representing a prior art projection printing system.

During the fabrication of integrated circuits or the like, a light projection system, generally indicated by the numeral 10 in FIG. 1 has been used. A semiconductor wafer 11 having a resist coating (not shown) is vertically aligned with an ultraviolet source 12 and focusing optics 13. Such a projection system 10 is manufactured by the Perkin-Elmer Company, as their Microline Model No. 240.

In operation, a photomask 16 is interposed between the ultraviolet source 12 and the focusing optics 13. The photomask 16 is comprised of a transparent substrate 17 such as fused silica with a metallic pattern 18 thereon. The ultraviolet radiation from the source 12 passes through the unmetallized areas 19 on the photomask 16 and is focused onto the resist coating on the semiconductor wafer 13 to expose and insolubilize (i.e., when using a negative acting resist) the resist coating. A suitable solvent is then employed to wash away the soluble resist coating in order that the exposed areas be further processed. Such a procedure is usually repeated a number of times using a plurality of photomasks 16 having different patterns 18 thereon to fabricate the desired circuits. Although the metallic pattern 18 does not contact the resist coated wafer 11 various cleaning and other handling operations result in deterioration of the pattern. Furthermore, electrostatic charges build up on the face of the mask resulting in arcing between portions of the metallic pattern, causing deterioration thereof.

Figure 2:
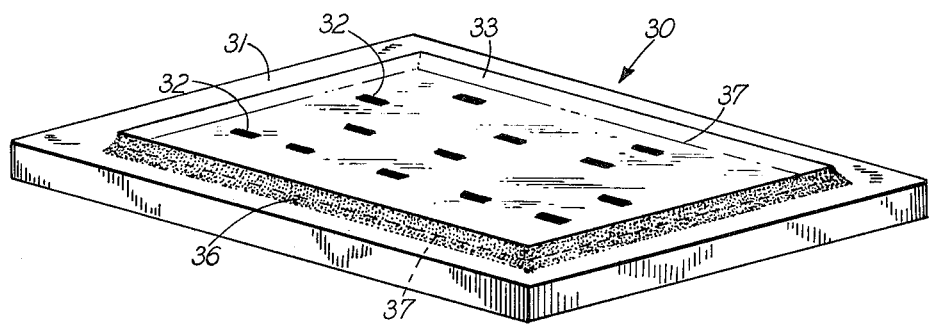
FIG. 2 is an isometric view of the instant photomask.

As hereinbefore indicated a protective coating deposited on the metallized pattern 18 on the photomask 16 has been found unacceptable for use in projection printing systems. Accordingly, a photomask 30 (see FIGS. 2 and 3) has been developed which incorporates features which overcome the foregoing deficiencies. The photomask 30 is comprised of a transparent baseplate 31 having a metallic pattern 32 thereon. A substantially flat, transparent, coverplate 33 is placed over the substrate 31. Additionally, an index matching fluid 34 (see FIG. 3) fills in the unmetallized volume between the baseplate 31 and the coverplate 33 to substantially eliminate interference fringes produced by light reflecting from the two surfaces in near contact. Bonding material 36 at the interface edge 37 between the baseplate 31 and the coverplate 33 holds the coverplate in place on the baseplate while sealing the index matching fluid 34 therein.

Preferably, the coverplate 33 and the baseplate 31 are both made of the same light transmissive material, and the index matching fluid 34 should have an index of refraction as close as possible to the materials from which the baseplate and coverplate are made. In an exemplary embodiment the coverplate 33 was fused silica having an index of refraction of nD=1.458 and the baseplate 31 was a transparent, low expansion glass having an unknown index of refraction. The index matching fluid 34 had the same index of refraction as the coverplate 33 and the metal used to form the pattern 32 was chrome. The index matching fluid 34 was composed of an aliphatic hydrocarbon hydrogenated terphenyl, type AA phthalate ester manufactured by R. P. Cargille Laboratories, Inc.

The photomask 30 not only has a longer life expectancy but requires only minor cleaning and less frequent reinspection. In addition deterioration of the metallic pattern on the photomask due to electrostatic arcing between portions of the pattern has been eliminated. Unexpectedly, the instant technique provides enhanced edge definition in the photoresist. Although the reason for such unexpected results are not clear it has been suggested that the index matching material fills in the relatively rough portions of the glass substrate formed when the metallic pattern was fabricated by well known etching processes. Accordingly, the effective elimination of such a rough surface substantially decreases scattering of the light passing therethrough which heretofore caused a slight blurring of the image.

Thus, the instant invention also contemplates the use of a mask wherein a thin layer of index matching material, having the same index of refraction as the baseplate, is deposited on at least the unmetallized surface thereof. The material may be applied by spraying, vapor deposition or the like depending upon the composition of the index matching material, the metal used to form the pattern and the composition of the baseplate.

The addition of coverplate 33 to the baseplate 31 in a projection printer system 10 (FIG. 1) requires certain adjustments due to effects on both first and third order aberrations of the optical system. The first order effect of the glass coverplate 33 is to move the paraxial image plane by an amount Δf given by $$\Delta f = t(1 - 1/n'), \tag{1}$$

where t and n' are the thickness and the index of refraction of the coverplate 33 respectively. This shift is taken into account by refocusing the printer. The size of the focal shift is also important in tolerancing the thickness of the coverplate 33. For example, since the projection printer used had a depth of focus on the order of 10 μm for 3 μm–4 μm features, the coverplate 33 must be flat to within 15 μm ($\Delta t = \Delta f/n'$). Actually, the required tolerance is much tighter since allowance must be made for flatness variation of the coated semiconductor wafer 11. Additionally, not only must the major surfaces of the coverplate 33 be substantially flat and parallel, but its thickness must be uniform to within the above tolerance. Also, the distance between the coverplate 33 and the baseplate 31 surface should be as uniform as practicable.

The primary higher order aberration introduced by the addition of the coverplate 33 is spherical aberration. Ray tracing shows this contribution to be quite small for an optical system with a numerical aperture of 0.1667 such as the particular printer used. For example, with a 0.5 mm thick coverplate 33, the spot size due to spherical aberration is 0.1 82 m at best focus and with a 1.0 mm coverplate 33 the spot size is 0.2 μm. These spot sizes are small when compared with the diffraction limited spot size of 1.25 μm. The spherical aberration also causes a shift in the optimal focal plane away from the paraxial focal plane, causing a shortening of the back focal distance.

The only other effect attributable to the coverplate 33 is a slight reduction in the projected image contrast. This results from the light reflected from the face of the coverplate 33 and illuminating the chrome pattern 32. Without the cover plate 33 the contrast of the chrome on glass pattern 32 is 100%. If there is a 4% reflection from the surface of the coverplate 33 and 100% reflection from the chrome than the contrast is reduced to no less than 92%. Because of the high contrast of the photoresist this contrast reduction does not seriously effect the printing process.

In a particular embodiment the coverglass 33 was fabricated by initially selecting a substantially defect-free fused quartz plate having dimensions of approximately 4⅜"×4½"×1/16". The plate was then wax mounted to the surface of a support member that has a flatness of ¼λ. The mounted plate is then lapped and polished to within 1 μm. The plate was then removed from the flat support member, turned over, and mounted on a ¼λ optical flat with intimate contact therebetween. An RTV silicone rubber adhesive was deposited at the edges of the plate to bond the plate to the optical flat. The plate is again lapped and polished until the plate has a thickness of 0.040"±0.0005" with the opposed major surfaces being parallel to within 4 μm maximum and a flatness of 4 μm maximum. The surface quality on both major surfaces should be approximately 20/10 as set forth in military specification MIL-0-13830.

It is preferred that the photomask 30 be assembled in a "clean room" environment to ensure a defect-free baseplate 31—coverplate 33 interface. The index matching fluid 34 is sequentially filtered through two Millipore GVHP 02500 0.2 μm filters and outgassed in a rough vacuum for approximately four hours to remove any dissolved gases therein and the baseplate 31 and the coverplate 33 are cleaned and dried. The coverplate 33 is then placed on the baseplate 31 (see FIGS. 2 and 3) and lightly pressed to remove any trapped air therebetween. The four corners of the coverplate 33 are then tack bonded to the base plate 31 using an epoxy adhesive. The adhesive should be allowed to dry thoroughly. The resulting assembly is then heated to approximately 70° C. and one or more drops of the index matching fluid 34 deposited at the interface edge 37 at one side of the coverplate 33. The fluid 34 will also be heated and be drawn between the coverplate 33 and the baseplate 31 by capillary action to fill the unpatterned volume therebetween as well as forming a thin layer of fluid between the metallic pattern 32 and the coverplate. Additional fluid 34 may be added as necessary as required to fill the volume between the coverplate 33 and the baseplate 31. To ensure that the volume is completely filled the assembly may heat overnight (e.g., approximately 15 hours) at 70° C.

Once the heat is removed and the assembly cooled to room temperature any excess fluid 38 is removed with a cloth lightly soaked with acetone. Then the interface edge 37 is sealed by applying a thin coating of RTV silicon rubber sealing material.

In an alternative embodiment a small pool of the index matching fluid 34 is deposited on the central portion of the baseplate 31 or the coverplate 33 prior to placing them into intimate contact. The fluid 34 is then heated to approximately 70° to 100° C. for several hours to fill in between the baseplate 31 and the coverplate 33. Again, a thin film of the fluid 34 will remain between the surface of the metallic pattern 32 and the coverplate 33. If it is apparent gas bubbles form between the baseplate 31 and the coverplate 33 they should be worked out by selectively applying pressure. Once all bubbles are removed the interface may be sealed as hereinbefore described.

Figure 5:
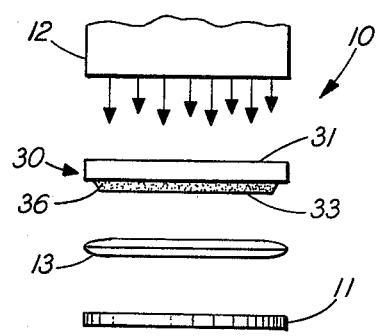
FIG. 5 is a schematic view depicting the instant projection system.

An exemplary embodiment of a light projection system 10, implemented using the instant techniques, is shown in FIG. 5. The photomask 30, shown in detail in FIG. 3, is positioned between the ultraviolet light source 12 and a photoresist coated substrate 11. Focusing optics 13 are positioned in spaced relation to the substrate 11. In operation, the light source 12 is activated to direct light radiation through the patterned photomask 30 to selectively expose the photoresist coated substrate 11 thereto. Such a projection printing method has resulted in an enhanced edge definition and virtually defect-free patterns in the photoresist.

It is to be understood that embodiments described herein are merely illustrative of the principles of the invention. Various modifications may be made thereto by persons skilled in the art which will embody the principles of the invention and fall within the spirit and scope thereof.

What is claimed is:

1. A photomask, comprising: a light transmissive baseplate having a metallic pattern thereon;
   a light transmissive coverplate having opposed, substantially parallel major surfaces, in intimate contact with the patterned baseplate; and
   a refractive index matching fluid interposed between, and having substantially the same refractive index as, the baseplate and the coverplate.

2. The photomask as set forth in claim 1, wherein:
   the surface of the coverplate is flat to at least 4 μm; and
   the opposed major surfaces of the cover plate are parallel to each other at least 4 82 m.

3. The photomask as set forth in claim 1, characterized by:
   a seal at the interface edge between the coverplate and baseplate to maintain the index matching material therebetween.

4. A method of selectively exposing a photoresist coated substrate to light radiation, comprising the steps of:
   positioning a photomask between a light source and the photoresist coated substrate, the photomask comprising:
   (a) a light transmissive baseplate having a metallic pattern thereon;
   (b) a light transmissive coverplate in intimate contact with the patterned baseplate;
   (c) a refractive index matching fluid interposed between, and having substantially the refractive index as, the baseplate and the coverplate; and
   activating the light source to direct light radiation through the photomask to selectively expose the photoresist coated substrate thereto.

* * * * *

UNITED STATES PATENT AND TRADEMARK OFFICE
CERTIFICATE OF CORRECTION

PATENT NO. : 4,361,643

DATED : November 30, 1982

INVENTOR(S) : E. L. Banks-B. E. Truax-L. S. Watkins

It is certified that error appears in the above—identified patent and that said Letters Patent is hereby corrected as shown below:

Column 1, line 21, "1 82m-2 μm" should read --1μm - 2μm--. Column 2, line 22, "sorce" should read --source--. Column 4, line 29, "0.1 82m" should read --0.1μm--; line 43, "than" should read --then--.

Column 6, Claim 2, line 25, "other at least 4 82m" should read --other to at least 4μm--.

Signed and Sealed this

First Day of March 1983

[SEAL]

Attest:

GERALD J. MOSSINGHOFF

Attesting Officer

Commissioner of Patents and Trademarks